(12) United States Patent
Chu et al.

(10) Patent No.: US 7,062,738 B1  
(45) Date of Patent: Jun. 13, 2006

(54) FLASH MEMORY COMPILER WITH FLEXIBLE CONFIGURATIONS

(75) Inventors: Kwan-Jen Chu, Hsinchu (TW); Hung-Chang Yu, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 611 days.

(21) Appl. No.: 10/205,518

(22) Filed: Jul. 25, 2002

(51) Int. Cl.  
*G06F 17/50* (2006.01)  
*G06F 9/45* (2006.01)

(52) U.S. Cl. ................... 716/8; 716/1; 716/7
(58) Field of Classification Search ............ 716/1, 716/7, 8  
See application file for complete search history.

(56) References Cited

U.S. PATENT DOCUMENTS

| | | | |
|---|---|---|---|
| 5,036,229 A * | 7/1991 | Tran ........................... 327/536 |
| 5,508,971 A | 4/1996 | Cernea et al. ........... 365/185.23 |
| 5,568,424 A | 10/1996 | Cernea et al. ........... 365/185.33 |
| 5,693,570 A | 12/1997 | Cernea et al. ............... 437/205 |
| 5,793,246 A * | 8/1998 | Vest et al. ................... 327/536 |
| 5,861,772 A * | 1/1999 | Lee ............................. 327/589 |
| 5,877,635 A | 3/1999 | Lin ............................... 326/83 |
| 6,032,221 A * | 2/2000 | Hongo ........................ 711/103 |
| 6,233,173 B1 | 5/2001 | Chevallier et al. ...... 365/185.03 |
| 6,388,923 B1 * | 5/2002 | Kuo et al. .............. 365/185.18 |
| 6,463,516 B1 * | 10/2002 | Leong et al. ................ 711/170 |
| 6,525,949 B1 * | 2/2003 | Johnson et al. ............... 363/60 |
| 6,883,078 B1 * | 4/2005 | Chen ........................... 711/165 |
| 2002/0136060 A1 * | 9/2002 | Taniguchi ............... 365/185.22 |
| 2002/0170019 A1 * | 11/2002 | Hsu et al. ........................ 716/1 |

OTHER PUBLICATIONS

Pavan, Paolo, et al. "Flash Memory Cells—An Overview", Proceedings of the IEEE, vol. 85, No. 8, Aug. 1997, pp. 1248-1271.*

Rajsauman, Rochit "Design and Test of Large Embedded Memories: An Overview", IEEE Design and Test of Computers, May-Jun. 2001, pp 16-27.*

Yeh, Jen-Chieh, et al. "Flash Memory Built-In Self Test Using March-Like Algorithms", Proceedings of the First IEEE International Workshop on Electronic Design, Test and Applications (DELTA'02), Jul. 2002.*

Lim, Hank, et al. "A Widely Configurable EPROM Memory Compiler for Embedded Applications", Proceedings, Memory Technology, Design and Testing, 1998, Aug. 24-25, 1998, pp. 12-16.*

\* cited by examiner

*Primary Examiner*—Stacy A. Whitmore  
*Assistant Examiner*—Magid Y. Dimyan

(57) ABSTRACT

This invention provides a compiler, circuits and a method for generating a flash memory for integrated circuits. This invention provides a flash memory compiler which can generate flexible configurations which are a function of the flash memory array bit count. In addition, this flash compiler of this invention has the ability to optimize the resultant flash memories so as to produce the correct amount of flash array current driving capability and minimal wasting of power dissipation as a function of the flash memory array size.

34 Claims, 4 Drawing Sheets

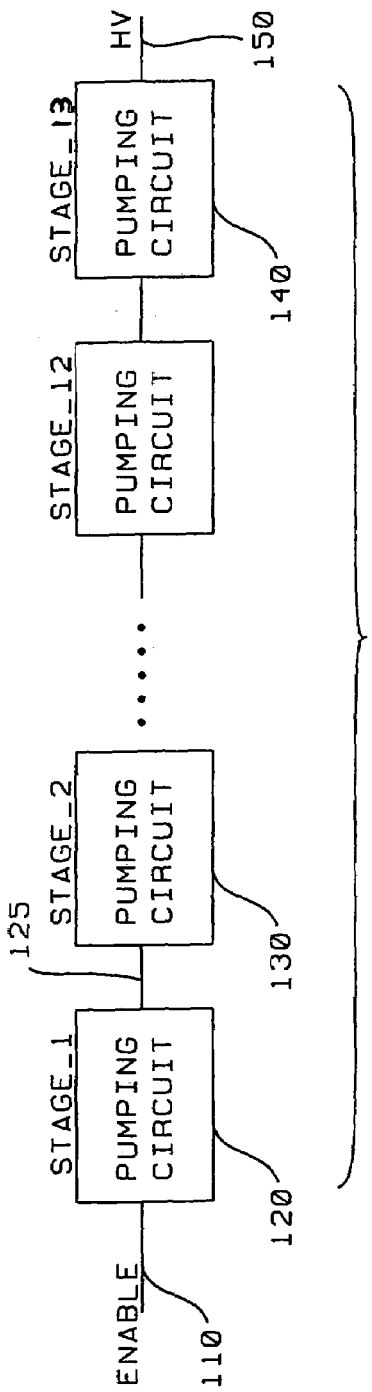
FIG. 1 - Prior Art
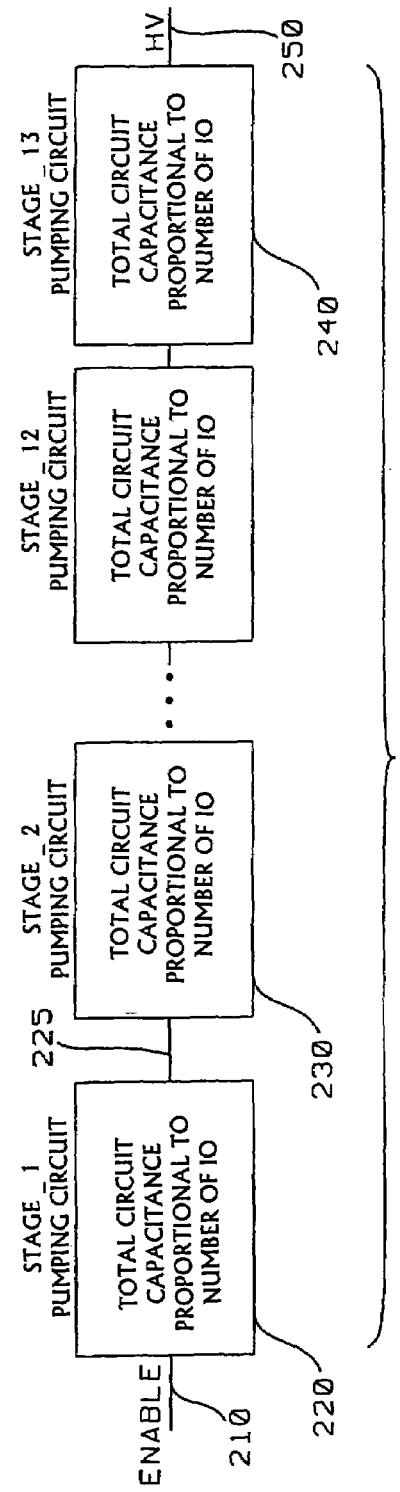
FIG. 2

FLASH MEMORY COMPILER WITH FLEXIBLE CONFIGURATIONS

BACKGROUND OF THE INVENTION

1. Field of the Invention

This invention relates to a compiler, circuits and a method for generating a flash memory for integrated circuits.

More particularly this invention relates to providing a flash memory compiler which can generate flexible configurations which are a function of the flash memory array bit count. In addition, this invention relates to the ability of a flash compiler to optimize the resultant flash memories so as to produce the correct amount of flash array current driving capability and minimal wasting of power dissipation.

2. Description of Related Art

FIG. 1 shows a prior art charge pumping circuit. There are thirteen stages of an identical charge pumping circuit macro 120. Each stage 120 has an input 110 and an output 125. The output 125 of one stage 120 feeds the input of the next stage 130. The logical input to the first stage is the Enable signal 110. This signal starts the charge pumping process. The output of the thirteenth and final stage 140 is the High Voltage signal, HV 150. The significant feature of the charge pumping circuit of FIG. 1 is that each stage contains the same pumping circuit with identical capacitance independent of flash array bit count or IO count.

U.S. Pat. No. 5,568,424 (Cernea, et al.) "Programmable Power Generation Circuit for Flash EEPROM Memory Systems" describes a voltage and power circuit to drive a variety of flash memory systems. These flash memories include those on the same chip and those off-chip.

U.S. Pat. No. 5,693,570 (Cernea, et al.) "Process for Manufacturing a Programmable Power Generation Circuit for Flash EEPROM Memory Systems" describes a process for making a variety of voltage and power generating circuits for various sizes and types of flash memories.

U.S. Pat. No. 5,693,570 (Cernea et al.) "Programmable Power Generation Circuit for Flash EEPROM Memory Systems" discloses a circuit for on-chip generation of voltage and power for flash memories.

BRIEF SUMMARY OF THE INVENTION

It is the objective of this invention to provide a compiler, circuits and a method for generating a flash memory for integrated circuits.

It is further an object of this invention to provide a flash memory compiler which can generate flexible configurations which are a function of the flash memory array bit count.

It is further an object of this invention to provide the ability of a flash compiler to optimize the resultant flash memories so as to produce the correct amount of flash array current driving capability and minimal wasting of power dissipation.

The objects of this invention are achieved by a flash compiler with flexible configurations. This compiler produces a floor plan with three portions, top, middle, and bottom. The flash compiler's top portion contains array related leafcell layout which could be increased in both x & y directions, source line drivers, and X-decode circuits. The flash compiler's middle portion contains X-precoder circuits, sense amplifier, IO MUX, and data in/data out buffer circuits which are increased in the x-direction. The flash compiler's bottom portion is 1 leafcell, containing HV block, reference block which contains reference voltages and currents, and test mode circuits. The flash compiler's bottom portion is designed with different number of columns to match the width of said top and said middle portion. The flash compiler's HV block in the bottom portion is made up of charge pump circuitry.

The charge pump circuitry is made up of N serially-connected stages of a basic charge pump circuit macro where N is typically 13 to produce voltages around 13 volts which is required to program and erase flash memories. The primary logic input to the first stage of the serial string of 13 stages is connected to an Enable signal. The primary logical output of the 13th and last stage is a HV or high voltage signal. The charge pump circuit macro is a pumping circuit which has a total internal circuit capacitance proportional to the number of IO in the flash array. The charge pump circuit macro contains two clock inputs. The charge pump circuit macros 1 through 13 contain two clock outputs which feed said two clock inputs of the subsequent charge pump stage. The logic outputs from one stage feed the logic inputs of the next stage.

The clock input 1 feeds two serially connected inverters. The clock input 2 feeds two serially connected inverters. The output of the two serially connected inverters is the charge pump circuit macro clock output 1. The output of the two serially connected inverters is the charge pump circuit macro clock output 2. Clock output 1 is connected to a capacitor C1. Clock output 2 is connected to a capacitor C2. Capacitor C1 has its second side connected to the drain of an n-channel metal oxide semiconductor field effect transistor, NMOS, FET 1, and connected to the gate of another NMOS FET 2. Capacitor C2 has its second side connected to the drain of said NMOS FET 2 and connected to the gate of NMOS FET 1. The sources of the NMOS FETs 1 and 2 are connected in common, to a charge pump circuit primary macro logic input.

BRIEF DESCRIPTION OF THE DRAWINGS

FIG. 1 shows a prior art string of charge pumping circuits.

FIG. 2 shows a string of charge pumping circuits of this invention.

DETAILED DESCRIPTION OF THE INVENTION

Figure 3:
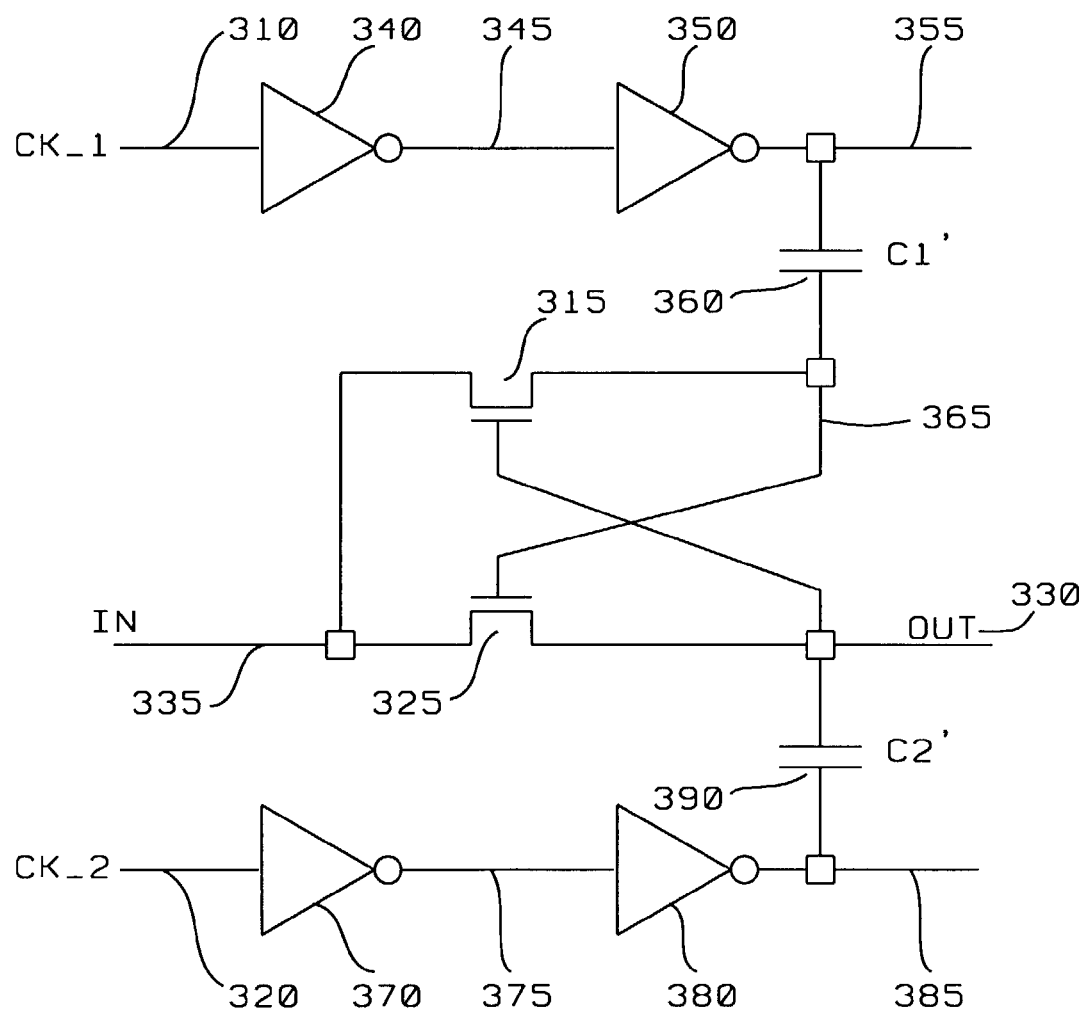
FIG. 3 shows the circuit detail of a single stage from the charging pumping string of circuits prior art string of charge pumping circuits.

FIG. 2 shows the charge pumping circuit which is the main embodiment of this invention. There are N stages of an identical charge pumping circuit macro 120, where N is typically 13 to allow the output voltage, HV to attain a value of around 13 volts which is required for programming and erasing flash memories. Each stage 220 has an input 210 and an output 225. The output 225 of one stage 220 feeds the input of the next stage 230. The logical input to the first stage is the Enable signal 210. This signal starts the charge pumping process. The output of the thirteenth or Nth-final stage 240 is the High Voltage signal, HV 250. The significant feature of the charge pumping circuit of FIG. 2 is that each stage 1–13 e.g. 220, 230, 240 contains the same pumping circuit whose capacitances (total capacitances of internal capacitors in the charge pumping circuit) are proportional to the IO count or bit count of the flash memory.

FIG. 3 shows one of the above charge pumping circuit stages. This circuit Stage is a main embodiment of this invention. This circuit stage has two clock signals, CK_1 (310) and CK_2 (320) which come from the previous stage. These two clock signals 310, 320 form a four-phase clocking system to operate the N-stage series of charge pumping circuits.

In addition, the circuit of FIG. 3 has a logical input, IN, 335 which also comes from the previous stage. The Enable primary input signal is the logical input 335 for the first stage charge pumping circuit.

The CK_1 clock signal 310 goes into the first of two inverters 340. The output 345 of the first inverter 340 goes into the second inverter 350. The output of the second inverter 355 goes to the corresponding CK_1 of the next stage. This second inverter output 355 also goes to one side of a capacitor C1 (360). The other side of capacitor C1 (360) goes to the drain of an N-channel metal oxide semiconductor field effect transistor, NMOS FET 315. It also goes to the gate of a second NMOS FET 325.

The CK_2 clock signal 320 goes into the first of two inverters 370. The output 375 of the first inverter 370 goes into the second inverter 380. The output of the second inverter 385 goes to the corresponding CK_2 of the next stage. This second inverter output 385 also goes to one side of a capacitor C2 (390). The other side of capacitor C2 (390) goes to the drain of an N-channel metal oxide semiconductor field effect transistor, NMOS FET 325. It also goes to the gate of a second NMOS FET 315.

The sources of both NMOS FETs 315 and 325 are tied in common and are attached to the logical input signal 335. Node 330 as shown in FIG. 3 is the logical output signal of the charge pumping stage. It feeds the corresponding logical input of the next stage.

The current produced by a single charge pump circuit stage of FIG. 3 can be calculated as follows.

$$I=C(dV/dt)$$

$$I=C(V/t)$$

where C is the capacitance C1 (360) or C2 (390) in FIG. 3, V is the voltage change across C and t is the time duration of the voltage change above. Also, the frequency, f, of the four-phase clocking system can be calculated as follows.

$$I=C(V/t)$$

$$I=CVf$$

$$F=I/(CV)$$

Figure 4:
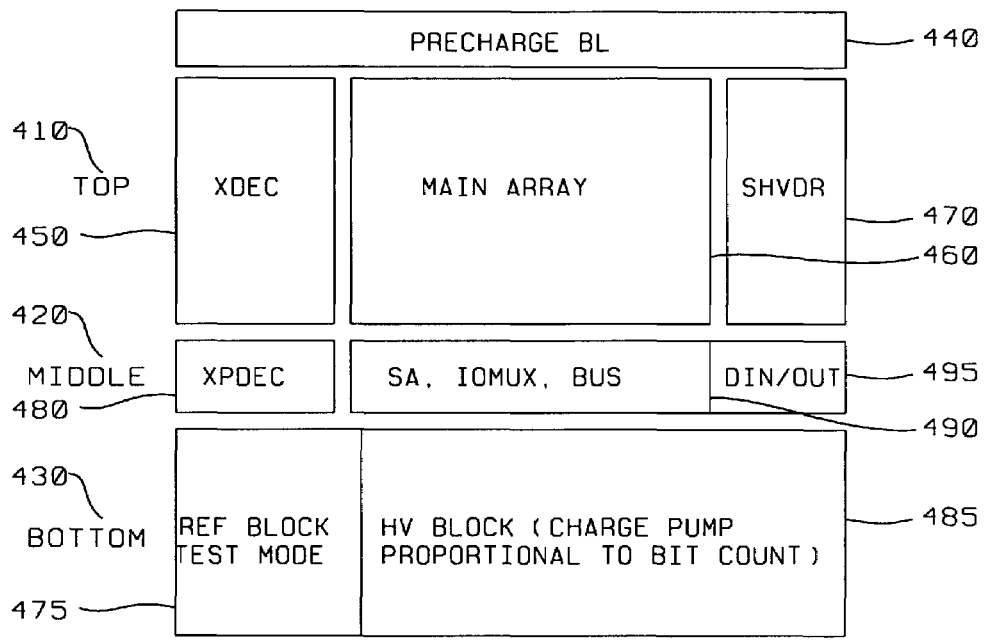
FIG. 4 illustrates a high level diagram of the floor plan of the flash memory circuit produced by the compiler of this invention.

FIG. 4 shows the overall high-level block diagram of the flash memory produced by the compiler of this invention. The bit line precharge circuit is shown 440. Next, the top portion 410 of the flash circuit contains the XDEC, x-decode circuit 450, the main flash memory array 460 and the SHVDR source line drivers 470. The middle portion 420 of the flash circuit contains the XPDEC, X-precoder circuit 480, the sense amplifier, SA, the IO multiplexor, IOMUX, the array bus 490, and data in/data out buffer circuits.

The bottom portion 430 contains the reference block (voltage and current references) and test mode circuitry 475.

It also contains the High Voltage block 485 which contains the charge pumping stages previously illustrated in FIGS. 2 and 3 and described above.

Figure 5A:
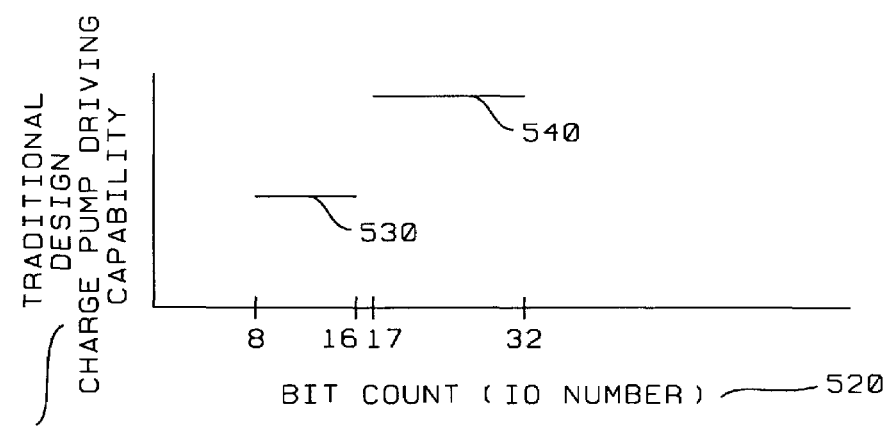
FIG. 5a gives a plot of current driving capability versus bit count for the prior art traditional design.

FIG. 5a shows a plot of charge pump current output or driving capability 510 as a function of flash memory bit count (IO number) 520. Graph 530 shows a constant current 510 being delivered independent of the flash memory bit count or IO number 520. Graph 530 represents the typical case for 8 or 16 IO in the flash array. Similarly, graph 540 shows a charge pump current flow which was designed for higher current or more drive capability. Graph 540 represents the typical case for 32 IO in the flash array. Again, graph 540 is independent of bit count 520.

Figure 5B:
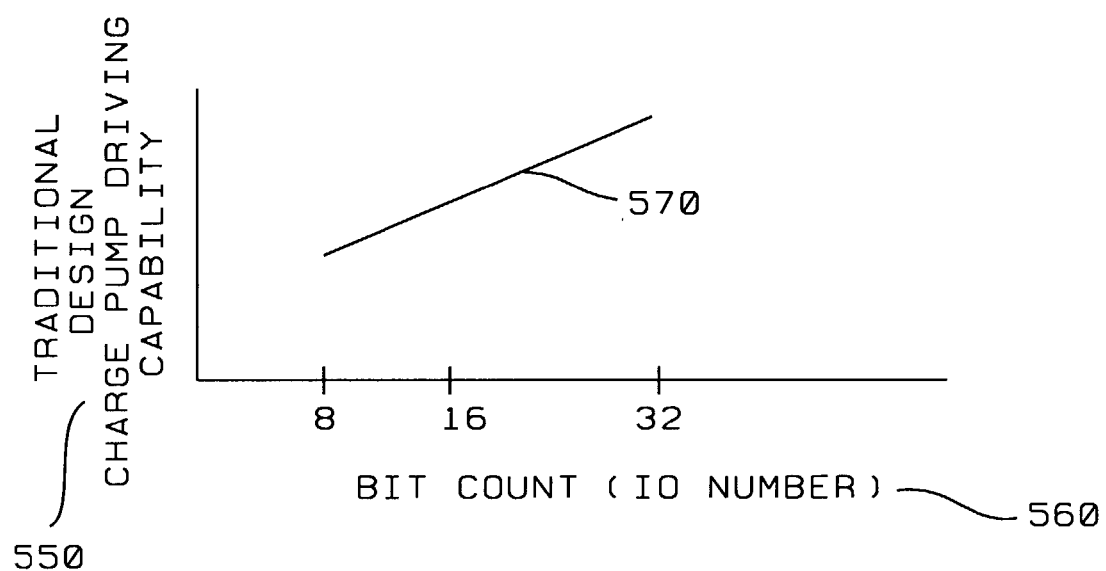
FIG. 5b gives a plot of current driving capability versus bit count for the circuit of this invention.

FIG. 5b shows the charge pump performance graph of this invention 570. It also is a plot of charge pump driving capability 550 versus bit count or IO number 560. It illustrates the main advantage of this invention over the prior art. The current output or charge pump driving capability 550 varies directly 570 as the bit count or IO count 560. This design is more efficient in the use of power and power dissipation.

The advantage of this invention is the flexible design of the basic charge pump circuit. This circuit's capacitance values are chosen to match closely the current drive requirements, which are dictated by the number of bits in the flash memory array. Referring to FIG. 3, the total internal circuit capacitance. i.e., the total capacitance of capacitor C1 (360) and capacitor C2 (390) of the basic charge pump circuit shown in FIG. 3, is dictated by and proportional to, the total number of bits in the flash memory array, thereby providing a flexible design. Since the charge pump circuitry's drive capability is designed to be directly proportional to the number of bits or IO cells in the array, the compiler of this invention produces an efficient flash memory circuit with lowest power and maximum performance.

While this invention has been particularly shown and described with Reference to the preferred embodiments thereof, it will be understood by those Skilled in the art that various changes in form and details may be made without Departing from the spirit and scope of this invention.

What is claimed is:

1. A flash compiler with flexible configurations:
and a floor plan with three portions comprising a top portion, a middle portion, and a bottom portion,
said bottom portion including a high voltage HV block made up of charge pump circuitry, said charge pump circuitry made up of N serially connected stages of a basic charge pump circuit macro, said basic charge pump circuit macro being a pumping circuit which has a total circuit capacitance proportional to a number of IO in a flash memory array of said flash compiler.

2. The flash compiler of claim 1 wherein said top portion contains an array related leafcell (basic building block cells) layout which could be increased in both x and y directions, X-decode circuitry, and source line driver.

3. The flash compiler of claim 1 wherein said middle portion contains X-predecoder, sense amplifier, IO multiplexor which is increased in the x-direction, and data in/data out buffer.

4. The flash compiler of claim 1 wherein said bottom portion is 1 leafcell, containing said HV block, a reference block, and test mode circuits.

5. The flash compiler of claim 4 wherein said bottom portion is designed with a different number of columns to match a width of said top and said middle portion.

6. The flash compiler of claim 1 wherein said N serially connected stages comprises 13 serially connected stages.

7. The flash compiler of claim 6 wherein a primary logic input to a first stage of said 13 serially connected stages is connected to an Enable signal.

8. The flash compiler of claim 6 wherein a primary logical output of a 13th and last stage of said stages is a HV or high voltage signal.

9. The flash compiler of claim 6 wherein each said basic charge pump circuit macro contains two clock inputs.

10. The flash compiler of claim 6 wherein each said basic charge pump circuit macros contains two clock outputs which feed two clock inputs of a subsequent charge pump stage of said stages.

11. The flash compiler of claim 6 wherein logic outputs from one stage of said stages, feed said logic inputs of a next stage of said stages.

12. The flash compiler of claim 1 wherein, a clock input 1 feeds two serially connected inverters having an output that is an output 1 of said basic charge pump circuit macro.

13. The flash compiler of claim 12 wherein said output 1 is connected to a first side of a capacitor C1.

14. The flash compiler of claim 13 wherein said capacitor C1 has its second side connected to the drain of an n-channel metal oxide semiconductor field effect transistor, NMOS, FET 1, and connected to the gate of another NMOS FET 2.

15. The flash compiler of claim 1 wherein a clock input 2 feeds two serially connected inverters having an output that is an output 2 of said basic charge pump circuit macro.

16. The flash compiler of claim 15 wherein said output 2 is connected to a first side of a capacitor C2.

17. The flash compiler of claim 16 wherein said capacitor C2 has its second side connected to the drain of said NMOS FET 2 and connected to the gate of said NMOS FET 1.

18. The flash compiler of claim 16 wherein the sources of said NMOS FETs 1 and 2 are connected in common, to a primary logic input of said basic charge pump circuit macro.

19. A method of producing a flash compiler with flexible configuration comprising the step of:
    implementing a floor plan for said flash compiler with flexible configuration,
    the floor plan including three portions including a top portion, a middle portion, and a bottom portion, said flash compiler including a high voltage (HV) block in said bottom portion made up of charge pump circuitry, said charge pump circuitry made up of N serially connected stages of a basic charge pump circuit macro, said basic charge pump circuit macro being a pumping circuit which has a total circuit capacitance proportional to a number of IO in a flash memory array of said flash compiler.

20. The method of producing a flash compiler of claim 19 wherein said top portion contains array related circuit macro which could be increased in both the x and y direction.

21. The method of producing a flash compiler of claim 19 wherein said middle portion contains X-predecoder, sense amplifier and IO multiplexor which is increased in the x-direction.

22. The method of producing a flash compiler of claim 19 wherein said bottom portion is 1 leafcell, containing an HV block, a reference block, and test mode circuits.

23. The method of producing a flash compiler of claim 22 wherein said bottom portion is designed with different number of columns to match a width of said top and said middle portion.

24. The method of producing a flash compiler as in claim 19 wherein said charge pump circuitry is made up of 13 serially connected stages of said basic charge pump circuit macro.

25. The method of producing a flash compiler of claim 24 wherein a primary logic input to a first stage of said 13 stages is connected to an Enable signal.

26. The method of producing a flash compiler of claim 24 wherein a primary logical output of said last stage of said 13 serially connected stages is a HV signal.

27. The method of producing a flash compiler of claim 24 wherein said basic charge pump circuit macro contains two clock inputs.

28. The method of producing a flash compiler of claim 24 wherein each of said 13 serially connected stages of said charge pump circuit macro contains two clock outputs which feed two clock inputs a subsequent stage of said stages.

29. The method of producing a flash compiler of claim 24 wherein logic outputs from one of said stages feed said logic inputs of a next stage of said stages.

30. A flash compiler with flexible configurations and a floor plan comprising three portions including a top portion, a middle portion and a bottom portion, wherein said top portion contains an array related leafcell (basic building block cells) layout which could be increased in both x and y directions, X-decode circuitry, and a source line driver, said middle portion contains an X-predecoder, a sense amplifier, an IO multiplexor which is increased in the x-direction, and data in/data out buffer and said bottom portion is 1 leafcell, containing a high voltage (HV), a reference block, and test mode circuits.

31. The flash compiler of claim 30 wherein said HV block in said bottom portion is made up of charge pump circuitry.

32. The flash compiler of claim 30 wherein said HV block is made up of charge pump circuitry, said charge pump circuitry made up of N serially connected stages of a basic charge pump circuit macro, said basic charge pump circuit macro being a pumping circuit which has a capacitance proportional to the number of IO in a flash memory array.

33. A method of producing a flash compiler with flexible configuration comprising the step of:
    implementing a floor plan for said flash compiler with a flexible configuration and including three portions comprising a top portion, a middle portion and a bottom portion,
    wherein said top portion contains array related circuit macro which could be increased in both the x and y direction, said middle portion contains an X-predecoder, a sense amplifier and an IO multiplexor which is increased in the x-direction, and said bottom portion is 1 leafcell, containing a high voltage (HV) block, a reference block, and test mode circuits.

34. The method of producing a flash compiler of claim 33, wherein said HV block is made up of charge pump circuitry.

* * * * *